(12) United States Patent
Haase et al.

(10) Patent No.: US 6,965,198 B2
(45) Date of Patent: Nov. 15, 2005

(54) ORGANIC LIGHT EMITTING FULL COLOR DISPLAY PANEL

(75) Inventors: Michael Albert Haase, Saint Paul, MN (US); Robert Carnes Williams, North Oaks, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/858,131

(22) Filed: Jun. 1, 2004

(65) Prior Publication Data

US 2004/0217699 A1 Nov. 4, 2004

Related U.S. Application Data

(63) Continuation of application No. 09/886,447, filed on Jun. 21, 2001, now Pat. No. 6,791,258.

(51) Int. Cl.⁷ .............................................. H05B 33/00
(52) U.S. Cl. ...................... 313/506; 313/501; 313/502; 313/504; 427/69; 427/282
(58) Field of Search ........................................ 313/506

(56) References Cited

U.S. PATENT DOCUMENTS 5,294,869 A  3/1994  Tang et al.
5,294,870 A  3/1994  Tang et al.
6,037,712 A  3/2000  Codama et al.
6,224,448 B1  5/2001  Tada et al.
6,255,775 B1  7/2001  Ikuko et al.
2001/0036691 A1  11/2001  Kitazume et al.

FOREIGN PATENT DOCUMENTS

EP  0 762 806  3/1997
EP  1 003 221 A2  5/2000
JP  10-319870  12/1998
WO  WO 00/10196  2/2000

OTHER PUBLICATIONS

O'Brien et al., "Improved Energy Transfer in Electrophosphorescent Devices", *Applied Physics Letters*, vol. 74, Issue 3, Jan. 18, 1999, pp. 442-444.

Marc Madou, *Fundamentals of Microfabrication*, CRC Press, 1997, pp. 168-176.

*Primary Examiner*—Nimeshkumar D. Patel
*Assistant Examiner*—Sharlene Leurig
(74) *Attorney, Agent, or Firm*—Douglas B. Little

(57) ABSTRACT

Pixels for organic light emitting full color display panels are made by simultaneously depositing red, green, and blue dopants such that the blue dopant is dispersed in at least one non-blue subpixel. Another aspect of the method relates to using a shadow mask comprising ribs which, in an angled evaporation method, can correct for parallax.

4 Claims, 3 Drawing Sheets

ORGANIC LIGHT EMITTING FULL COLOR DISPLAY PANEL

CROSS REFERENCE TO RELATED APPLICATIONS

This application is a continuation of U.S. Ser. No. 09/886,447, filed Jun. 21, 2001 now U.S. Pat. No. 6,791,258, now pending, the disclosure of which is herein incorporated by reference.

TECHNICAL FIELD

This invention relates to full color organic light emitting display devices and methods of making them.

BACKGROUND

Organic light emitting devices (OLEDs) are useful for a variety of applications including displays, graphic signs, and lighting applications. High resolution OLEDs that can provide a full range of colors are particularly desirable. Commercial development of full color OLEDs requires patterning the light emitting area, i.e., the pixel, with three primary colors (red, green, and blue) to provide a full color display.

SUMMARY OF INVENTION

The present invention features a novel method of making an organic light emitting color display panels using vacuum angle-evaporation techniques.

In one aspect of the invention, the inventors have found that, surprisingly, if a blue dopant is deposited with a red or green dopant during the construction of a pixel, the red or green color will dominate. This is an important factor in producing a full-color light emitting display. In another aspect, the inventors have found a way to correct for parallax during the making of a display panel. This is an important factor in producing large high resolution display panels.

One aspect of the present invention provides a method of making organic light emitting pixels having red, green, and blue subpixels on a display panel comprising:

for each pixel, depositing a hole transporting layer and an electron transporting layer; and depositing red, green, and blue dopants simultaneously in a host layer such that the blue dopant is deposited on the blue subpixel and at least one of the red and green subpixels. The host layer may be the hole transporting layer, the electron transporting layer, or a layer between the hole transporting and electron transporting layers.

Another aspect of the invention involves using a shadow mask during the deposition process. The shadow mask may be integrated into the display panel, or may be removable and, optionally, reusable. The integrated mask may comprise photoresist, including dry film photoresist. The removable mask may be made from crystalline material (such as silicon), metal, or polymer.

In another aspect of the invention, the red and green dopant sources may be located on opposite sides of the display at an angle of about 20° to about 70°, typically 40°, from the pixel surfaces and the blue dopant and other material sources may be located in a plane that bisects the substrate and is normal to a straight line that connects the red and green dopant sources.

In another aspect of the invention, the deposition paths of the red and green dopants are isolated from each other and the other sources with shields that start at the red and green dopant sources and extend some distance toward the pixel surface.

Another aspect of the invention provides a method of correcting for parallax in the making of an organic light emitting display panel comprising using line-of-sight vapor deposition to create a series of adjacent pixels, each pixel comprising sub-pixels, wherein one or more sources are positioned at an angle of about 20° to about 70°, typically about 40°, from the pixel surfaces and wherein a shadow mask is used in the deposition process, the mask having slots defined by ribs wherein the pitch of the ribs is smaller than the pitch of the pixels.

Another aspect of the invention is an article comprising an organic light emitting full color display panel wherein a blue dopant is dispersed over at least one non-blue sub-pixel.

Another aspect of the invention provides an organic light emitting color display panel comprising: a plurality of full color pixels formed on a substrate, each full color pixel comprising a red, a green, and a blue subpixel, an integrated shadow mask, that corrects for parallax, for forming the color subpixels comprising a plurality of ribs erected on the substrate, wherein the pitch of the ribs is smaller than the pitch of the pixels. The integrated mask may comprise photoresist material, including dry film photoresist.

Yet another aspect of the present invention provides a removable mask for making an organic light emitting full color display panel by angled evaporation, the mask comprising a series of ribs that define slots in which individual pixels are built. The height of the ribs of the mask may be approximately equal to the width of the pixels of the display panel. The mask may also have ribs with a pitch smaller than the pitch of the pixels on the substrate for which it will be used.

As used in this invention:

"display panel" means a two-dimensional array of individual pixels;

"parallax" or "parallax error" means the difference in shadow length at different points on a substrate caused by the source being a finite distance from the substrate;

"pitch" means the center to center distance between two adjacent structures of the same type;

"pixel" means an area of an image display array that can be stimulated to emit light independently of other areas; and "sub-pixel" means an area of a pixel that can be addressed to emit light of a particular color in a multi-color display.

An advantage of at least one embodiment of the present invention is that red, green, and blue dopants and a host layer may be deposited simultaneously in a single process step, which can make the construction process faster.

Another advantage of at least one embodiment of the present invention is that it provides a full-color display panel having high brightness, high contrast, low manufacturing costs, and excellent visibility at all viewing angles.

Another advantage of at least one embodiment of the present invention is that the removable shadow mask may be reused. Using a removable mask may also allow for a simpler process because it does not require applying material (e.g., photoresist) on the substrate to form a mask. A removable mask also results in a substantially planar substrate (after deposition and removal of the mask), which can be easier to use in subsequent processing steps.

Another advantage of at least one embodiment of the present invention is that it provides a more efficient and reliable blue-emitting subpixel having a more desirable blue color.

Another advantage of at least one embodiment of the present invention is that it allows for parallax correction, which is especially desirable for making large display panels in a chamber of a limited size.

Advantages of at least one embodiment of the present invention that includes angle-evaporation of dopants (in comparison to having discrete emitting layers) for an OLED include that the operating voltages of each of the color subpixels are nearly equal, the OLED has good quantum efficiency, improved reliability, excellent resolution between subpixels, and good color saturation.

Other features and advantages of the invention will be apparent from the following drawings, detailed description, and claims.

DETAILED DESCRIPTION

The present invention provides methods of making organic light emitting color display panels.

Figure 1:
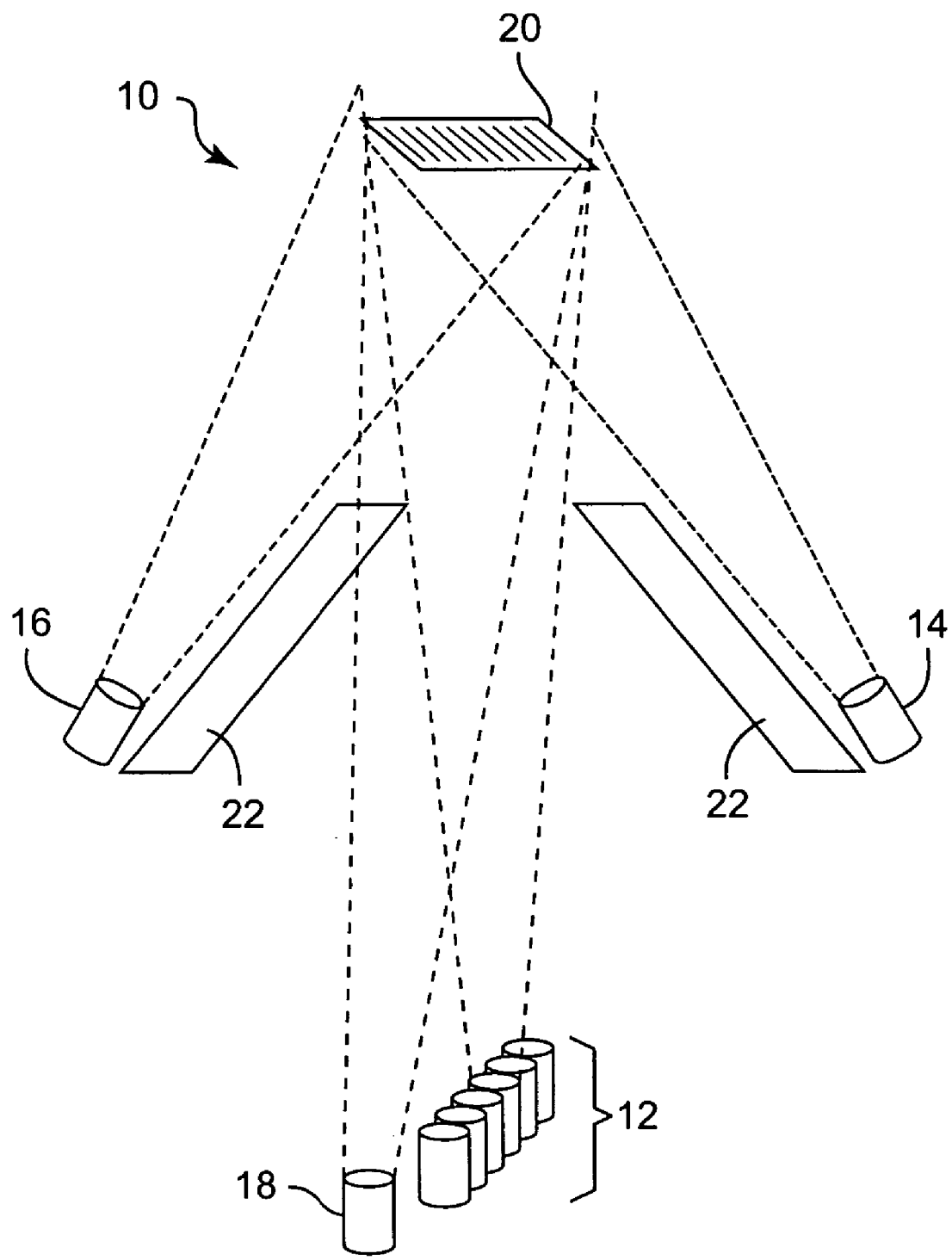
FIG. 1 depicts a deposition system for constructing an organic light emitting color display panel.

As illustrated by system 10 in FIG. 1, an OLED can be made pursuant to this invention by arranging sources 12 for the OLED structure, except for the red and green dopant sources 14 and 16 (but including the blue dopant source 18) in a line near the bottom of a deposition chamber. Blue dopant source 18 is typically separated from the other OLED sources, but is in the same line as the other sources. In general the OLED and blue dopant sources are located in a plane that bisects the display panel substrate and is normal to an imaginary straight line that connects the red and green dopant sources. Typically an OLED is constructed by depositing layers on a transparent conductor layer, but alternative constructions are also feasible, such as depositing a transparent electrode material on top of layers of organic materials. These different methods of construction are known in the art. Display substrate 20 (e.g., a glass or polymer substrate) includes patterned electrodes that define the emitting area for the subpixels. The electrodes may take the form of parallel lines for a passive-matrix display, or individual subpixel areas connected to appropriate thin-film transistor driver circuits for an active-matrix display. The substrate, placed above (and typically in contact with) a shadow mask, can then be positioned with the shadow mask ribs aligned parallel to and directly over the line of sources. The red and green dopant sources are located away from the line of sources such that the evaporant beams from the red and green sources impinge the substrate surface at an angle between about 20° and about 70°, typically about 40°, from normal. The appropriate angle will depend on the height and spacing of the ribs.

Applicants found that there is a further advantage in using shields 22 to isolate a portion of the deposition path of each of the red and green dopants such that the dopant beams do not come into contact with the beam of the host layer material and the blue dopant until they are in the proximity of the pixel surface. By shielding the deposition paths, scattering of the dopant molecules is minimized so that each dopant color is concentrated in the desired subpixel. This minimization of inter-beam scattering of the dopants provides good resolution of the sub-pixels at higher deposition rates.

Typically, the deposition chamber is evacuated to less than $1\times10^{-5}$ Torr ($1.3\times10^{-3}$ Pa), or even less than $2\times10^{-6}$ Torr ($2.6\times10^{-4}$ Pa). A low pressure also helps to minimize scattering of the red and green dopants into the wrong subpixels, which would degrade the quality of the subpixel colors.

Figure 2:
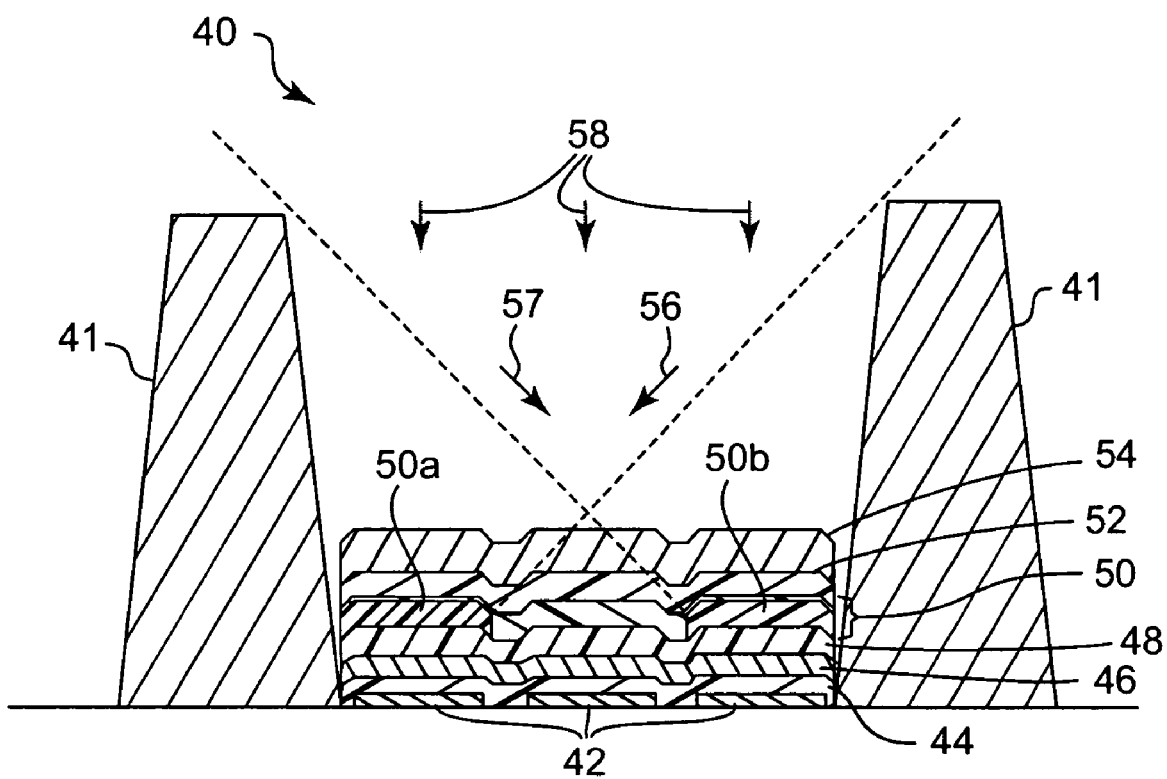
FIG. 2 depicts a cross section of a pixel and the angles at which red, blue, and green dopants are deposited.

FIG. 2 shows a construction 40 that can be made per the present invention. The figure depicts an OLED structure between ribs 41. The layers of the OLED are sequentially deposited at an angle near normal to the substrate such that they cover nearly all of the area between the ribs. Anode 42 of the OLED typically comprises a transparent conductor, such as indium tin oxide. Optional buffer layer 44 comprising e.g., polypyrrole, poly(ethylenedioxythiophene) (PEDOT), or polyaniline, may be deposited between anode 42 and hole injection layer 48. Optional hole injection layer 46, e.g., copper Phthalocyanine (CuPc), may also be deposited between anode 42 and hole injection layer 48. The OLED further comprises hole transport layer 48, e.g., N,N'-Di(naphthalen-1-yl)-N,N'diphenylbenzidine(NPB), or N,N,N',N'-tetrakis(4-methylphenyl)(1,1'-biphenyl)-4,4'-diamine (TPD); and electron transport layer 50, e.g., (1,1'-Bisphenyl-4-Olato)bis(2-methyl-8-quinolinolato)Aluminum (BAlq), or 4,4'-bis(2,2'-diphenylvinyl)biphenyl (DVPBi). Optional electron injection layer 52, e.g., LiF, Li, or Li—Al, may be deposited before cathode layer 54, e.g., Al, Ca, Ba, or Mg—Ag, which is subsequently applied by vapor deposition. In this construction the electron transporting layer functions as the host layer for the dopants. Red and green dopants are deposited in directions 56 and 57, respectively, in discrete areas 50a and 50b of the host layer, while the blue dopant is deposited in direction 58 throughout the host layer. In other constructions, other layers can serve as the dopant host, including the hole transporting layer or an additional host layer located between the hole transporting layer and the electron transporting layer. This additional host layer may comprise, for example, 4,4'-Bis(carbazol-9-yl)biphenyl (CBP)(see, for example, "Improved Energy Transfer in Electrophosphorescent Devices," D. F. O'Brien, M. A. Baldo, M. E. Thompson, and S. R. Forrest, *Applied Physics Letters,* Jan. 18, 1999, Volume 74, Issue 3 pp. 442–44) or other hole transporting or electron transporting materials.

One aspect of the present invention comprises simultaneously depositing red, blue, and green dopants when the host layer is deposited. The dopants are deposited directionally as indicated in FIG. 2 so that the red and green dopants are deposited over a single subpixel and the blue dopant may be deposited over all three subpixels. Although it was unexpected, the applicants found that the color of the red and green dopants dominated the color of the simultaneously deposited blue dopant thereby allowing the blue dopant to be deposited over one or both of the red and green subpixels without interfering with the quality and clarity of the OLED.

Red dopants suitable for use in the present invention include, e.g., platinum octaethylporphyrin (PtOEP), or 4-(dicyanomethylene)-2-t-butyl-6-(1,1,7,7-tetramethyljulolidyl-9-enyl)-4H-pyran (DCJTB).

Blue dopants suitable for use in the present invention include, e.g., perylene.

Green dopants suitable for use in the present invention include, e.g., 10-(2-bensothiazolyl)-2,3,6,7,tetrahydro-1,1,7,7-tetramethyl-1H,5H,11H-(1)benzopyropyrano (6,7,8-i j)quinolizin-11-one (C545T), N,N-dimethyl quinacridone (DMQA), or tris(2-phenylpyridine)iridium (Ir(ppy)$_3$).

The dopant concentrations in the host layer are typically on the order of about 1 molar percent. Optionally, a second electron transporting layer (not shown), e.g., tris(8-hydroxyquinolinato) aluminum (Alq3), may be deposited over a doped electron transport layer to improve electron injection.

As previously mentioned, an aspect of the present invention involves depositing dopants using an angle evaporation technique that employs a shadow mask. A shadow mask may be integrated into the display panel such that the ribs are constructed on, or as part of, the substrate to define the outer edges of a pixel. Alternatively, the shadow mask may be removable and reusable. With a removable mask, ribs define a slot through which materials may be vapor deposited onto the substrate.

The ribs of a mask can partially block the deposition of a dopant so that only a portion of the pixel receives the dopant, thereby allowing the formation of red, green, and blue sub-pixels. (This is generally illustrated in FIG. 2.) For example, a source for a red dopant may be located to the left of a pixel at an angle of about 20° to about 70° from normal to the substrate such that, due to the location and height of a rib on the left side of the pixel, the red dopant is only deposited on the right third portion of the pixel (i.e., the right subpixel). Similar positioning may be done on the right side of the pixel for the green dopant source. Because of the applicants' discovery that emission from the red and green dopants will dominate the emission from a simultaneously deposited blue dopant, the blue dopant may be deposited at an angle normal to the surface of the pixel, in relation to the location of the other dopant sources, so that it covers the entire pixel.

The height of the ribs of the mask will determine the length of the shadow cast. The desired length of the shadow can depend on factors such as the angle at which the deposition source is placed, the distance of the deposition source from the pixel, and the area desired to be covered by the evaporant. In most cases, the preferred height of the ribs is comparable to the width of the pixel.

As previously stated, the masks of the present invention may be permanently attached to the display devices or may be removable. A permanently attached, i.e., integrated, photoresist shadow mask may be made by conventional photolithography, see, e.g., U.S. Pat. Nos. 5,294,869, and 5,294,870, incorporated by reference. The photoresist may be a dry film photoresist, which is a film that can be applied with a roller. Dry film photoresist is available as item # MP130 from MacDermid, Waterbury, Conn.

A removable mask comprises a series of slots that are defined by ribs. Materials comprising pixels are deposited through the slots. Materials suitable for making a removable mask include crystalline materials such as silicon, metal materials such as copper and steel, and polymeric materials. A removable mask is typically made by removing material where the slots will be located, while leaving intact the material that forms the ribs. A removable mask may be made by a variety of techniques, including conventional machining; micromachining; diamond machining; laser ablation; or chemical, plasma, or ion beam etching (typically patterned by photolithography). Electric discharge machining (EDM), also called electrodischarge or spark-erosion machining, is a well-known technique that can be used for making a mask. EDM works by eroding material in the path of electrical discharges that form an arc between an electrode tool (in this case a wire) and the work piece.

Wafers of crystalline materials (e.g., silicon, germanium, or gallium arsenide) are particularly well suited for making removable, reusable masks for angle evaporation. Silicon wafers of appropriate thickness (e.g., 100–200 $\mu$m) and polished on both sides, are widely available. The ribs required for use as an angle evaporation mask can be fabricated with well known processes including standard photolithography and etching. The pattern may be etched through the wafer by any appropriate technique including anisotropic wet chemical etching (see Marc Madou, *Fundamentals of Microfabrication*, CRC Press, 1997, p. 168–176), or anisotropic ion etching (see U.S. Pat. No. 5,501,893).

Figure 3:
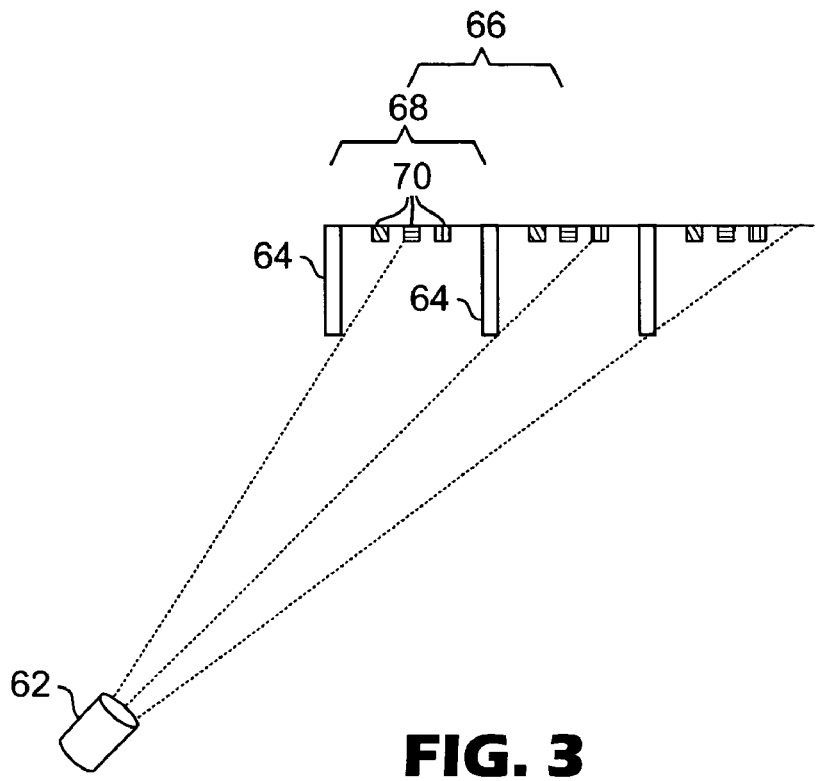
FIG. 3 depicts parallax.

In making display panels, the deposition sources for the OLED materials (including the blue dopant) are approximately point sources or line sources. The red and green dopant sources are approximately point sources located at an angle at the sides of the substrate. FIG. 3 illustrates a common problem in angle deposition known as parallax. Because dopant source 62 is a finite distance from the substrate, the horizontal lengths of the shadows cast by each set of ribs 64 will vary across the width of the substrate due to parallax effects. The ribs of a standard shadow mask have the same pixel pitch 66, i.e., distance from center to center of a pair of ribs, as rib pitch 68, i.e., distance from center to center of a pair of pixels. Parallax error can cause angled deposition sources for individual pixels and subpixel electrodes 70 on a single display panel to be misaligned with the subpixel electrodes on which they are to be deposited.

Figure 4:
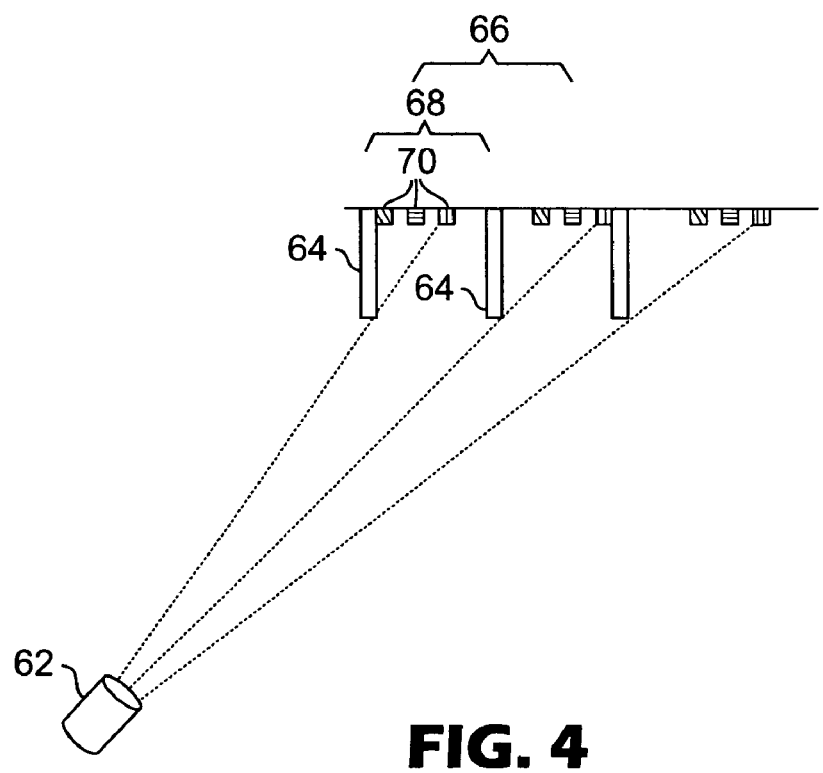
FIG. 4 depicts a mask that corrects for parallax.

As illustrated by FIG. 4, an aspect of the present invention corrects parallax error by providing precise alignment of the angled dopant sources being deposited through ribs 64 with subpixel electrodes 70 patterned on the substrate by making pixel pitch 66 slightly larger than rib pitch 68 on the mask according to the following formula:

$$p'=p(1+h/d)$$

where p' is the pitch of the pixels (corresponding to the pitch of the electrodes),
p is the pitch of the ribs of the shadow mask,
d is the height of the substrate above the source, and
h is the height (i.e., thickness) of the shadow mask.

In using the masks of the present invention, the source of the dopants is preferably separated from the pixels by a distance that is at least 5 times the width of the display.

The invention may be illustrated by way of the following examples.

EXAMPLES

This invention may be illustrated by way of the following example.

In this example, a passive-matrix OLED display was fabricated by angle evaporation of OLED materials through a removable metal shadow mask. The OLED was built on a glass substrate with a 140 nm thick coating of indium tin oxide (ITO) transparent conductor, provided by Thin Film Devices (Anaheim, Calif.). The ITO was etched into column electrodes using conventional photoresist patterning and etching in warm (60° C.), concentrated HCl. The pixels were arranged in a 0.075" (1.905 mm) by 0.075" (1.905 mm) grid. Three ITO columns were located under each pixel, corresponding to red, blue and green subpixels. Each column was nominally 0.011" (280 $\mu$m) wide, with a gap of 0.0055" (140 $\mu$m) between the subpixel columns.

A removable and reusable metal shadow mask was fabricated from a steel plate (0.047" (1.194 mm) thick) using wire electric discharge machining (Wire EDM). Slots machined into the steel plate measured 0.065" (1.651 mm) wide and 0.0746" (1.895 mm) center-to-center (i.e., pitch), leaving ribs having a width of 0.0096" (0.244 mm) (with a pitch of 0.0746" (1.895 mm), and a height of 0.047" (1.194 mm)). The small difference in pitch between the metal mask (0.0746" (1.895 mm)) and the ITO columns (0.075" (1.895 mm)) were appropriate to compensate for parallax in an evaporator system in which the substrate was positioned about 9" (229 mm) above the sources.

The substrate with etched ITO lines was coated with a spun-on conductive polymer buffer layer of polyethylene-dioxythiophene such as Baytron P available from Bayer (Pittsburgh, Pa.) and dried on a hot plate (100° C.) in a nitrogen atmosphere. The substrate was then placed on the metal mask and the ITO columns were aligned with the slots in the mask. The mask and substrate were clamped together and positioned in the vacuum evaporator system, which was evacuated to approximately $10^{-6}$ torr ($1.3 \times 10^{-4}$ Pa). A hole transporting layer (HTL) was first applied (NPB) with an approximate thickness of 30 nm. Then an electron transporting layer (ETL) was applied (BAlq) which also acted as a host for the dopants. Approximately 20 nm of the ETL nearest the HTL was doped, followed by approximately 20 nm of undoped ETL. The dopants used were perylene (blue), C545T (green) and PtOEP (red). The HTL, ETL, and blue dopant sources were arranged at the bottom of the evaporator chamber, in a line directly beneath and parallel to the ITO columns. The red and green dopant sources were placed some distance from that line, so that the evaporant beams from those dopant sources impinged the substrate at an angle of about 40° from normal. Ribs of the mask cast a shadow such that the green and red dopants impinged only on the appropriate ITO subpixel columns, and not on the subpixel columns for the other colors. The blue dopant was deposited on all three subpixels, but in the green and red subpixels, the green and red dopants effectively dominated the emission spectrum so that any blue emission from those subpixels was inconsequential.

After deposition of these organic materials, the evaporator chamber was vented, and the shadow mask was removed from the substrate and replaced with another shadow mask with slots that ran orthogonal to the ITO columns. This second shadow mask was used to pattern rows of cathode electrodes in a second vacuum evaporation process. The cathode was formed by deposition of 0.5 nm of LiF followed by 200 nm of Al. Alternatively, the cathode could have been formed with 20 nm of Ca followed by 200 nm of Al.

After deposition of the cathode, the substrate was removed from the deposition chamber and the cathode shadow mask was removed. The display was essentially complete, and ready for encapsulation. This passive-matrix display was operated by sequentially applying a voltage to each of the cathode rows and simultaneously addressing each of the subpixels with the appropriate current to provide the light emission desired for each row of the display as it was addressed.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. An organic light emitting color display panel comprising:
   a plurality of full color pixels formed on a substrate, each full color pixel comprising a red, a green, and a blue subpixel,
   an integrated shadow mask for forming the full color pixels in an angle evaporation process, comprising a plurality of ribs between pixels and erected on the substrate said ribs being located only between adjacent pixels with one rib between each adjacent pixel,
   and a plurality of shadowed regions on the substrate on which one colored dopant is deposited and where deposition of a different colored dopant is blocked by the ribs during the angle evaporation process,
   wherein the shadowed regions vary in length across the substrate due to parallax during the process,
   wherein the pitch of the ribs is smaller than the pitch of the pixels, and wherein the pitch of the ribs corrects for parallax in the process.

2. The display panel of claim 1 wherein the mask comprises photoresist material.

3. The display panel of claim 2 wherein the photoresist comprises dry film photoresist.

4. The display panel of claim 1 on which the pitch of the pixels is determined by the following formula: $p'=p(1+h/d)$ in which
   $p'$ is the pitch of the pixels,
   $p$ is the pitch of the ribs of the shadow mask,
   $d$ is the height of the substrate above a source of colored dopant to be deposited in the angle evaporation process, and
   $h$ is the height of the shadow mask.

* * * * *